United States Patent [19]

Myers et al.

[11] Patent Number: 4,893,088

[45] Date of Patent: Jan. 9, 1990

[54] TRANSIMPEDANCE FOCAL PLANE PROCESSOR

[75] Inventors: Brent A. Myers, Palm Bay; William W. Wiles, Jr., West Melbourne, both of Fla.

[73] Assignee: Harris Corporation, Melbourne, Fla.

[21] Appl. No.: 271,656

[22] Filed: Nov. 16, 1988

[51] Int. Cl.[4] .......................... G11C 27/02; H03F 1/08
[52] U.S. Cl. ...................... 328/127; 307/491; 307/261; 307/353; 328/151
[58] Field of Search ............... 328/127, 128, 162, 165, 328/167, 151; 307/491, 261, 352, 353; 330/9

[56] References Cited

U.S. PATENT DOCUMENTS 3,579,124  5/1971  O'Hara ............................. 307/491
3,902,053  8/1975  Figueroa ........................... 328/127
3,978,399  8/1976  Chadbourne ........................ 330/9
3,989,961  11/1976 Masreliez .......................... 328/127
4,211,981  7/1980  Lerma ............................. 307/491
4,384,257  5/1983  Nola .............................. 307/491
4,578,646  3/1986  Maio et al. ....................... 307/491
4,760,345  7/1988  Büsser et al. ..................... 307/491
4,833,345  5/1989  Miller ............................ 307/491

Primary Examiner—Stanley D. Miller
Assistant Examiner—Timothy P. Callahan
Attorney, Agent, or Firm—Barnes & Thornburg

[57] ABSTRACT

A transimpedance processor includes a feedback circuit for generating a voltage as a function of the input background level and precharging the capacitor of the input integrator to a negative of the generated voltage in a precharge cycle.

19 Claims, 2 Drawing Sheets

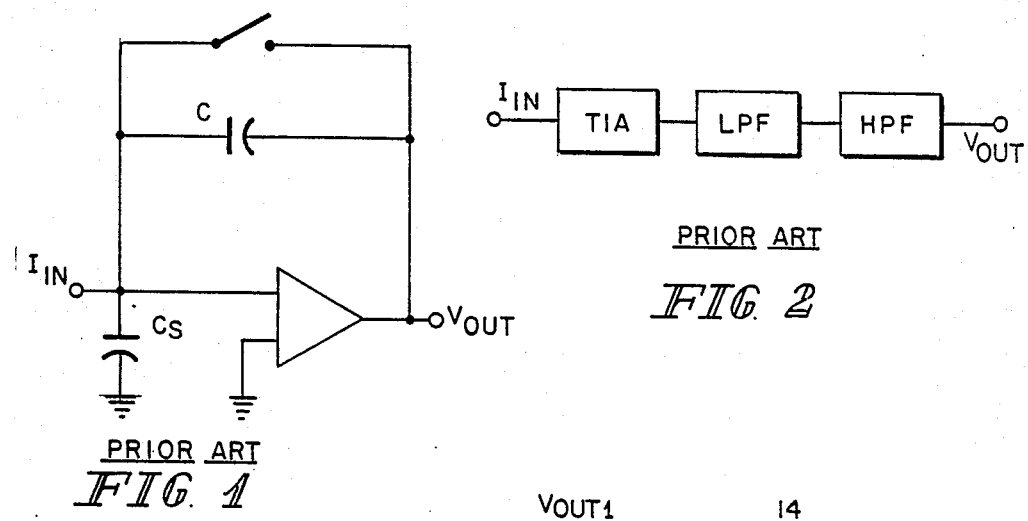
PRIOR ART
FIG. 2
PRIOR ART
FIG. 1
FIG. 3
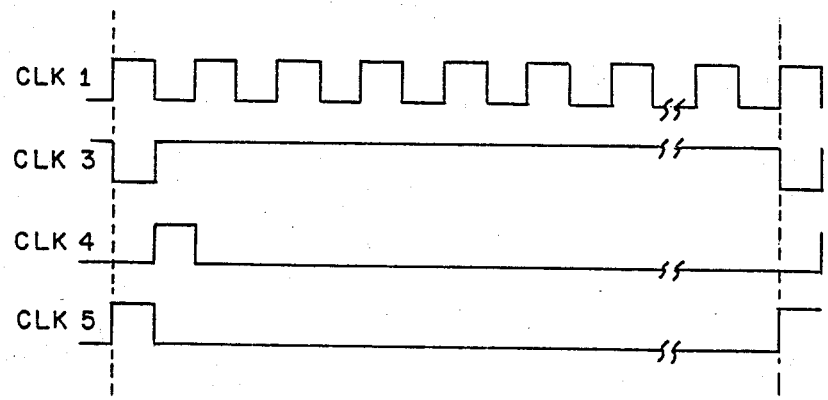
FIG. 5

TRANSIMPEDANCE FOCAL PLANE PROCESSOR

BACKGROUND AND SUMMARY OF THE INVENTION

The present invention relates generally to signal processors and more specifically to a transimpedance processor which converts low level photocurrents into voltage levels and processes these signals for improved signal detection.

Current state of the art realizes the transimpedance (TIA) function with the reset integrator shown in FIG. 1. Transimpedance gain is a function of integrate time and capacitor size given by:

$G = t_o/C$, $t_o$ = Integrate time.

The current method of signal processing involves following the TIA with cascaded highpass and lowpass filters to remove undesirable noise and background contamination. A block diagram of this technique is shown in FIG. 2. A problem with this technique is that in cases where large dc currents exist at the detector output (background contamination), dynamic range at the output of the TIA is severely limited for ac signals of interest. Further 1/f noise of the amplifier is multiplied by the ratio Cs/C which further degrades performance.

Thus, it is an object of the present invention to improve the dynamic range.

Another object of the present invention is to reduce the output noise due to 1/f noise of the amplifier.

Still another object of the present invention is to provide a dc signal which arises from the background, as well as the ac data of interest.

A further object of the present invention is to provide the dc signal without compromising the ac signals' dynamic range which the existing art is not capable of providing.

These and other objects are achieved by a feedback circuit for generating a voltage as a function of the input background level and precharging the capacitor of the input integrator to a negative of the generated voltage in a precharge cycle. A sample and hold network, which may include a lowpass filter, is connected to the output of the input integrator and samples and holds the output thereof. The feedback precharge circuit includes an integrator to integrate the outputs of the sample and hold. A switching arrangement connects the output of the precharge integrator to a first terminal of the capacitor of the input integrator which is connected to the output of the input integrator during a precharge cycle and connects the first terminal to the output of the input integrator during a measurement cycle.

The sample and hold circuit includes a second capacitor having a first terminal connected to the output of the input integrator during a measurement cycle and connected to a reference terminal, for example ground, during the precharge cycle. The precharge integrator includes an input capacitor having a first terminal connected to the input of a precharge integrator and a second terminal connected to the output of the sample and hold to charge the input capacitor during a portion of a cycle and being connected to the reference terminal or ground during another portion of the cycle to discharge the input capacitor. The precharge integrator includes an amplifier having a feedback capacitor having one terminal connected to the amplifier's input and a second terminal connected to the amplifier's output through a switch which is normally closed and is open while the input capacitor is being discharged. Another switch connects the input of the precharge amplifier to its output when the input capacitor is being discharged.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic of a reset integrator of the prior art.

FIG. 2 is a block diagram of a current signal processor method of the prior art.

FIG. 3 is a block diagram of a signal processor incorporating the principles of the present invention.

FIG. 5 shows graphs of the timing pulses for use in FIG. 4.

DETAILED DESCRIPTION OF THE DRAWINGS

Figure 4:
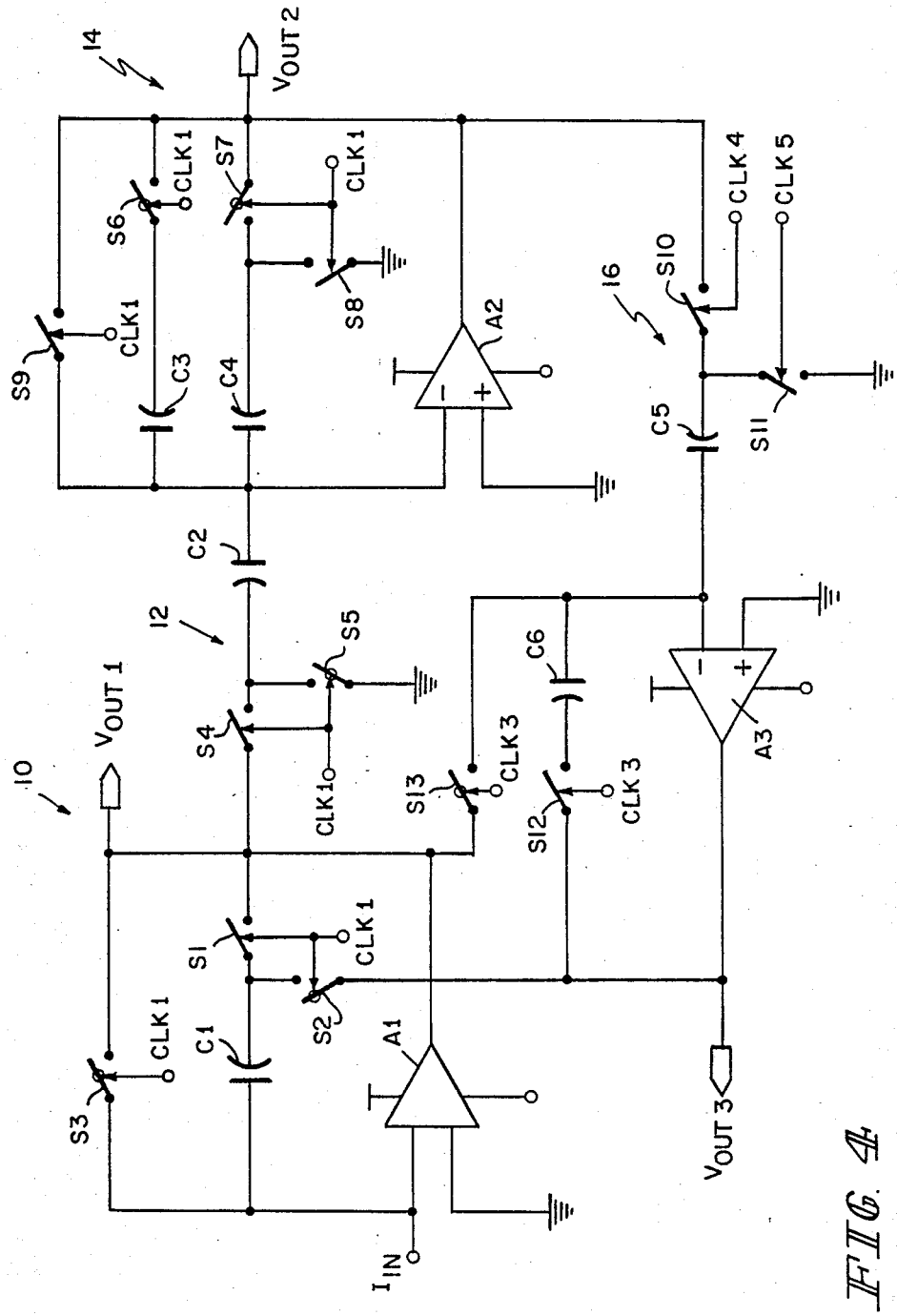
FIG. 4 is a schematic of the block diagram of FIG. 3.

A transimpedance processor according to the present invention is illustrated in FIG. 3 as including a transimpedance or input integrator 10 having a current input which is generally connected to a photodetecting diode. The output of the input integrator 10 is provided to the input of a combination sample and hold and lowpass filter 14. The output of the lowpass filter, which is the AC signal of interest, is provided at output terminal Vout2 as well as to the feedback integrator 16. The feedback integrator extracts the dc signal level to provide a precharge on the input transimpedance integrating capacitor C1. Thus, the DC signal is available as Vout 3.

During a measurement cycle, the current input is integrated by the input integrator 10 and sampled and filtered by the combination sample and hold and lowpass filter circuit 14. The lowpass output is integrated by integrator 16 which during a precharge cycle applies the negative value of the sensed signal to the capacitor of the input integrator 10.

During the precharge cycle of the input integrator 10, not only the background level of the detector is sensed, but the 1/f noise of the amplifier A1 is sampled as well. In this way, during the integrate cycle, the 1/f noise is cancelled.

The input transimpedance integrator 10 includes an operational amplifier A1 having its positive terminal connected to a first reference, illustrated as ground, and the input current signal connected to its negative input. The capacitor C1 has a first terminal connected to the negative input of the operational amplifier A1. A switch S1 connects the second terminal of the capacitor C1 to the output of the operational amplifier A1. A switch S2 connects the second terminal of capacitor C1 to the output of the integrator 16 and a switch S3 connects the output to the input of operational amplifier A1.

It should be noted that throughout the schematic of FIG. 4, each of the switches are controlled by a clock signal. If the arrow connecting the switch has a plain head, it is responsive to be closed on a high clock pulse and open on a low clock pulse. If the arrow has a circle at the end, indicating an inverted response, the switch is open during a high clock pulse and is closed during a low clock pulse. In the input integrator 10 the switches S2 and S3 are responsive to the inverted clock pulses CLK 1.

The sample and hold and lowpass filter circuit 14 includes a second capacitor C2 having its first terminal connected to the output of the input integrator 20 by a switch S4. The first terminal is also connected to a reference voltage or ground through switch S5. The switch S4 is responsive to clock pulse CLK 1 and S5 is responsive to the inverse of clock pulse CLK 1.

The second terminal of C2 is connected to the negative input of operational amplifier A2. The positive input of operational amplifier A2 is connected to the first reference terminal or ground. Capacitor C3 has a first terminal connected to the negative input of operational amplifier A2 and a second terminal connected through switch S6 to the output of the operational amplifier A2. A second capacitor C4 has its first terminal connected to the negative input of operational amplifier A2 and its second terminal connected to the output of operational amplifier A2 by switch S7. A switch S8 also connects the second terminal of capacitor C4 to a reference voltage or ground. Switch S9 connects the output to the input of operational amplifier A2. Switches S6 and S7 are responsive to the inverse of the clock pulse CLK 1 wherein switches S8 and S9 are responsive to the clock pulse CLK 1.

The feedback integrator 16 includes an input capacitor C5 having a first terminal connected to the output of the sample and hold by switch S10. The first terminal of capacitor C5 is also connected to a reference voltage or ground by a switch S11. The switch S10 is responsive to the clock pulses CLK4 whereas switch S11 is responsive to the clock pulses CLK5. The other terminal of capacitor C5 is connected to the negative input of an operational amplifier A3. The positive input of operational amplifier A3 is connected to the reference voltage or ground. A capacitor C6 has a first terminal connected to the negative input of operational amplifier A3 and a second terminal connected through switch S12 to the output of the operational amplifier. Switch S13 connects the output to the input of operational amplifier A3. Switch 12 is responsive to the clock pulse CLK3 whereas switch S13 is responsive to the inverse of clock pulse CLK3. As previously described, the output of operational amplifier A3 and the integrator 16 is connected to switch S2 in the input integrator 10.

The operation of the circuit of FIG. 4 will be explained with reference to the timing diagram of FIG. 5 for the clocks 1, 3, 4 and 5. During time interval 1 with 1 high, switch S1 is closed and switches S2 and 3 are open. Thus, the amplifier A1 is connected as an integrator integrating the current input I-IN. During this same period, the sampling filter circuit 12 includes closed switch S4 which connects the output of the integrator to the capacitor C2 and opens switch S5. The capacitor C2 is charged to the value of the output of the integrator 10. Switch S8 is closed, grounding the terminal of C4 and causing it to discharge to ground. Switch S9 is closed, providing a unity gain amplifier A2. Switches S7 and S6 are open.

The width of the pulse of clock 1 determines the measurement period. Once the measurement period is over, the clock pulse CLK1 goes low, opening switch S1 and closing switches S2 and S3. Assuming that the integrator 16 has an output signal from prior cycles, the closing of S2 applies this value to the terminal or plate of capacitor C1 which is connected to the output of the input amplifier A1. This will appear as a negative value once the circuit is again connected as an integrator. With S3 closed during this reset cycle, the amplifier A1 operates as a unity gain amplifier providing the 1/f noise of A1 on capacitor C1 along with the feedback integrator voltage.

During this precharge phase, S4 is open, disconnecting the capacitor C2 from the output of the input integrator 10 and S5 is closed, connecting the charging terminal of capacitor C2 to ground. Switches S8 and S9 of the lowpass filter 14 are open and switches S6 and S7 are closed. The amplifier A2, with the capacitors C3 and C4, act as a lowpass filter for the signal which was stored on capacitor C2 and provided it at the output V-OUT2, as well as to the integrator 16. The charge of capacitor C2 is also dissipated to ground during the precharge cycle.

The integrator 16 beginning at the first cycle of clock 1, closes switch S13 and opens switch S12 by clock pulse 3. This causes amplifier A3 to be a unity gain amplifier and disconnects the capacitor C6 from the feedback loop. Clock pulse CLK5 is high which closes switch S11, connecting the charging terminal of capacitor C5 to ground. Clock pulse CLK4 is low and therefore switch S10 is open. This offers a discharge path for capacitor C5 while the charge on capacitor C6 remains. During the first reset cycle, clock pulse CLK3 goes high, clock pulse CLK4 goes high and clock pulse CLK5 goes low. This causes switch S10 to close and switch S11 to open which connects the output of the lowpass filter to capacitor C5 to charge it. In the feedback loop of amplifier A3, switch S3 is open and switch S12 is closed connecting capacitor C6 in the feedback loop of amplifier A3. This allows the charge from capacitor C5 to be integrated and transferred to the capacitor C6 which accumulates it with charges from previous integration cycles.

As will be noted from FIG. 5, the time constant of the integrator 16, using clocking cycles alone, is substantially greater than that of the input integrator 10. The integrator 16 is activated once every plurality of cycles as shown by clocks 3, 4 and 5, compared to the number of cycles of clock 1.

As a further means or example, the value of capacitor C5 compared to C6 is that C6 is 100 times the value of C5 and therefore, the value voltage of C6 is incremented by 1/100 of the input voltage for every cycle of the integrator 16. In a typical example, C5 may be 0.1 pico farad while C6 would be ten pico farad. As a further example of design characteristics, capacitor C1 could be 1 pico farad, capacitor C2 be 0.05 pico farad, capacitor C3 be 1 pico farad, and capacitor C4 be 0.05 pico farad.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A transimpedance processor for converting photocurrents into voltage comprising:
   input integrator means for integrating input signals over a measurement cycle on a first capacitor of said input integration means;
   S/H mans connected to an output of said input integrator means for sampling and holding the output of said integrating means; and precharge means connected between an output of said S/H means and said first capacitor and including a precharge integrator means for integrating output of said S/H means and generating a voltage as a function of input background level and switching means for precharging said first capacitor with negative of the output of said precharge integrator means in a precharge cycle.

2. A transmission processor according to claim 1, wherein:
said input integrator means includes a first amplifier means having an input and an output and said first capacitor having a first terminal connected to said first amplifier means' input and a second terminal; and
said switching means includes a first switch means connected between said first capacitor's second terminal and said first amplifier means output, and a second switch means connected between said first capacitor's second terminal and output of said precharge integrator means, and control means for closing said first switch means and opening said second switch means during a measurement cycle and opening said first switch means and closing said second switch means during a precharge cycle.

3. A transimpedance processor according to claim 2, wherein said switching means further includes a third switch means connected between said first amplifier means' input and output; and said control means opens said third switch during measurement cycles and closes said third switch during precharge cycles.

4. A transimpedance processor according to claim 2, wherein:
said S/H means includes a second capacitor having first and second terminals, a fourth switch means connected between said second capacitor's first terminal and said first amplifier means' output, and a fifth switch means connected between said second capacitor's first terminal and a reference terminal; and
said control means closes said fourth switch means and opens said fifth switch means during said measurement cycle and opens said fourth switch means and closes said fifth switch means during said precharge cycle.

5. A transimpedance processor according to claim 4, wherein said S/H means includes a low pass filter connected between said second capacitor's second terminal and said precharge means.

6. A transimpedance processor according to claim 2, wherein:
said precharge integrator means includes a third capacitor having a first terminal connected to an input of said precharge integrated means and a second terminal, a sixth switch means connected between said third capacitor's second terminal and output of said S/H means, and a seventh switch means connected between said third capacitor's second terminal and a reference terminal; and
said control means closes said seventh switch means to reset said third capacitor while said sixth switch means is open, and closes said sixth switch means to charge said capacitor with the output of S/H means while said seventh switch means is open.

7. A transimpedance processor according to claim 6, wherein said control means closes said seventh switch means during a measurement cycle and closes said sixth switch means during a subsequent precharge cycle.

8. A transimpedance processor according to claim 7, wherein said control means closes said sixth and seventh switch means only once over a plurality of measurement and precharge cycles.

9. A transimpedance processor according to claim 6, wherein:
said precharge integrator means further includes second amplifier means having an input and output, fourth capacitor having a first terminal connected to said second amplifier means' input and a second terminal, eighth switch means connected between said fourth capacitor's second terminal and said second amplifier means' output, and a ninth switch means connected between said second amplifier means input and output; and
said control means opens said eighth switch means and closes said ninth switch means when said seventh switch means is closed, and closes said eighth switch means and opens said ninth switch means when said seventh switch means is open.

10. A transimpedance processor according to claim 1:
wherein said precharge integrator means includes a third capacitor having a first terminal connected to an input of said precharge integrated means, a sixth switch means connected between a second terminal of said third capacitor and output of said S/H means, and a seventh switch means connected between said third capacitor's second terminal and a reference terminal; and
including control means for closing said seventh switch means to reset said third capacitor while said sixth switch means is open, and closing said sixth switch means to charge said capacitor with the output of S/H means while said seventh switch means is open.

11. A transimpedance processor according to claim 10, wherein said control means closes said seventh switch means during a measurement cycle and closes said sixth switch means during a subsequent precharge cycle.

12. A transimpedance processor according to claim 10, wherein:
said precharge integrator means further includes second amplifier means having an input and output, a fourth capacitor having a first terminal connected to said second amplifier means' input, eighth switch means connected between a second terminal of said fourth capacitor and said second amplifier means' output, and a ninth switch means connected between said second amplifier means input and output; and
said control means opens said eighth switch means and closes said ninth switch means when said seventh switch means is closed, and closes said eighth switch means and opens said ninth switch means when said seventh switch means is open.

13. A transimpedance process comprising:
first amplifier means having an input and an output;
first capacitor having a first terminal connected to said first amplifier means' input;
S/H means connected to said first amplifier means output for sampling and holding output signal of said first amplifier means output during a measurement cycle;

precharge integrator means connected to said S/H means for integrating outputs of said S/H means and having an output; and switching means connected between a second terminal of said first capacitor, said precharge integrator means' output and said first amplifier means' output for connecting said first capacitor's second terminal to said first amplifier means' output during a measurement cycle and for connecting said first capacitor's second terminal to said precharge integrator means during a precharge cycle.

14. A transimpedance process according to claim 13, wherein said switching means includes:

a first switch means connected between said first capacitor's second terminal and said first amplifier means output;

second switch means connected between said first capacitor's second terminal and output of said precharge integrator means;

a third switch means connected between said first amplifier means' input and output; and control means for closing said first switch means and opening said second and third switch means during a measurement cycle and opening said first switch means and closing said and third second switch means during a precharge cycle.

15. A transimpedance process according to claim 13, wherein:

said S/H means includes a second capacitor having a first terminal, a fourth switch means connected between said second capacitor's first terminal and said first amplifier means' output, and a fifth switch means connected between said second capacitor's first terminal and a reference terminal; and said control means closes said fourth switch means and opens said fifth switch means during said measurement cycle and opens said fourth switch means and closes said fifth switch means during precharge cycle.

16. A transimpedance process according to claim 15, wherein said S/H means includes a low pass filter connected between a second terminal of said second capacitor and said precharge means.

17. A transimpedance process according to claim 13, wherein:

said precharge integrator means includes a third capacitor having a first terminal connected to an input of said precharge integrated means, a sixth switch means connected between a second terminal of said third capacitor and output of said S/H means, and a seventh switch means connected between said third capacitor's second terminal and a reference terminal; and said control means closes said seventh switch means to reset said third capacitor while said sixth switch means is open, and closes said sixth switch means to charge said capacitor with the output of S/H means while said seventh switch means is open.

18. A transimpedance processor for converting photocurrents into voltage comprising:

input integrator means for integrating input signals over a measurement cycle on a first capacitor of said input integration means;

S/H means connected to an output of said input integrator means for sampling and holding the output of said integrating means; and including a second capacitor having a first terminal, a first switch means connected between said second capacitor's first terminal and said first amplifier means' output, and a second switch means connected between said second capacitor's first terminal and a reference terminal;

precharge means connected between an output of said S/H means and said first capacitor for generating a voltage as a function of input background level and precharging said first capacitor to a negative of said generated voltage in a precharge cycle; and control means for closing said first switch means and opening said second switch means during said measurement cycle and opening said first switch means and closing said second switch means during said precharge cycle.

19. A transimpedance processor according to claim 18, wherein said S/H means includes a low pass filter connected between a second terminal of said second capacitor and said precharge means.

* * * * *